(12) United States Patent
Gao

(10) Patent No.: US 11,271,262 B2
(45) Date of Patent: Mar. 8, 2022

(54) SHELF DESIGN FOR BATTERY MODULES

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/571,792

(22) Filed: Sep. 16, 2019

(65) Prior Publication Data

US 2021/0083340 A1   Mar. 18, 2021

(51) Int. Cl.
| | |
|---|---|
| *H01M 10/627* | (2014.01) |
| *H05K 7/14* | (2006.01) |
| *H05K 7/20* | (2006.01) |
| *H01M 10/613* | (2014.01) |
| *H01M 10/6568* | (2014.01) |
| *H01M 10/655* | (2014.01) |

(52) U.S. Cl.
CPC ....... *H01M 10/627* (2015.04); *H01M 10/613* (2015.04); *H01M 10/655* (2015.04); *H01M 10/6568* (2015.04); *H05K 7/1492* (2013.01); *H05K 7/20781* (2013.01); *H01M 2220/10* (2013.01)

(58) Field of Classification Search
CPC ............. H01M 10/613; H01M 2/1077; H01M 10/6557; H01M 10/6568; H01M 2/1016; H01M 6/42; H04M 8/0267; H04M 8/04029; F28F 3/12; H05K 7/20781; H05K 7/20563; H05K 7/20636; H05K 7/20772; H05K 7/1488; H05K 7/20736; G06F 1/20
See application file for complete search history.

(56) References Cited

U.S. PATENT DOCUMENTS

| | | | | | |
|---|---|---|---|---|---|
| 5,460,900 | A | * | 10/1995 | Rao | H01M 2/0242 429/120 |
| 7,324,336 | B2 | * | 1/2008 | Vos | H05K 7/1404 165/104.33 |
| 7,508,670 | B1 | * | 3/2009 | Thorson | H05K 7/20636 165/104.33 |
| 7,547,487 | B1 | * | 6/2009 | Smith | H01M 2/0242 429/100 |
| 8,411,440 | B2 | * | 4/2013 | Dunwoody | H05K 7/20781 165/104.33 |
| 2003/0232239 | A1 | * | 12/2003 | Gow | H01M 10/6567 429/120 |
| 2004/0086780 | A1 | * | 5/2004 | Ebermann | H05K 7/20609 429/120 |

(Continued)

*Primary Examiner* — Michael A Matey
(74) *Attorney, Agent, or Firm* — Womble Bond Dickinson (US) LLP

(57) ABSTRACT

Shelf designs for battery modules are disclosed. A liquid cooling method for battery thermal management is also introduced using the shelf design. A backup battery system shelf comprises a cooling frame and a thermal conductive pad disposed on one or more surfaces of the shelf. The cooling frame can house a backup battery unit (BBU) or module. The cooling frame is configured to circulate a cooling liquid in and out of the cooling frame. The thermal conductive pad is configured to transfer heat from a BBU module to the cooling frame and liquid circulating within the cooling frame. The BBU module can also include a cooling frame circulating a cooling liquid to transfer heat away from the BBU module.

9 Claims, 13 Drawing Sheets

(56) References Cited

U.S. PATENT DOCUMENTS

| | | | | |
|---|---|---|---|---|
| 2005/0089750 A1* | 4/2005 | Ng | H01M 2/0242 | 429/120 |
| 2006/0056142 A1* | 3/2006 | Takahashi | G11B 33/142 | 361/679.33 |
| 2006/0223433 A1* | 10/2006 | Matsuzawa | H05K 7/20563 | 454/184 |
| 2009/0253026 A1* | 10/2009 | Gaben | H01M 2/0262 | 429/56 |
| 2010/0033921 A1* | 2/2010 | Copeland | H05K 7/20781 | 361/679.47 |
| 2011/0217575 A1* | 9/2011 | Hermansson | H01M 2/1072 | 429/82 |
| 2011/0286177 A1* | 11/2011 | Attlesey | H05K 7/20772 | 361/679.53 |
| 2013/0031382 A1* | 1/2013 | Jau | H02J 9/061 | 713/300 |
| 2013/0135811 A1* | 5/2013 | Dunwoody | H05K 7/20818 | 361/679.31 |
| 2013/0244077 A1* | 9/2013 | Palanchon | H01M 10/6567 | 429/120 |
| 2013/0253715 A1* | 9/2013 | Cho | H01M 10/425 | 700/286 |
| 2013/0322012 A1* | 12/2013 | Dunwoody | G06F 1/20 | 361/679.53 |
| 2014/0277784 A1* | 9/2014 | Mick | H05K 7/1498 | 700/286 |
| 2015/0162651 A1* | 6/2015 | Nakahama | H01M 10/6551 | 429/120 |
| 2017/0303440 A1* | 10/2017 | Shimasaki | H05K 7/20509 | |
| 2018/0026296 A1* | 1/2018 | Kruger | H01M 10/6567 | 429/120 |
| 2018/0026319 A1* | 1/2018 | Haskins | H01M 10/617 | 429/62 |
| 2019/0140235 A1* | 5/2019 | Lindstrom | H01M 2/1077 | |

\* cited by examiner

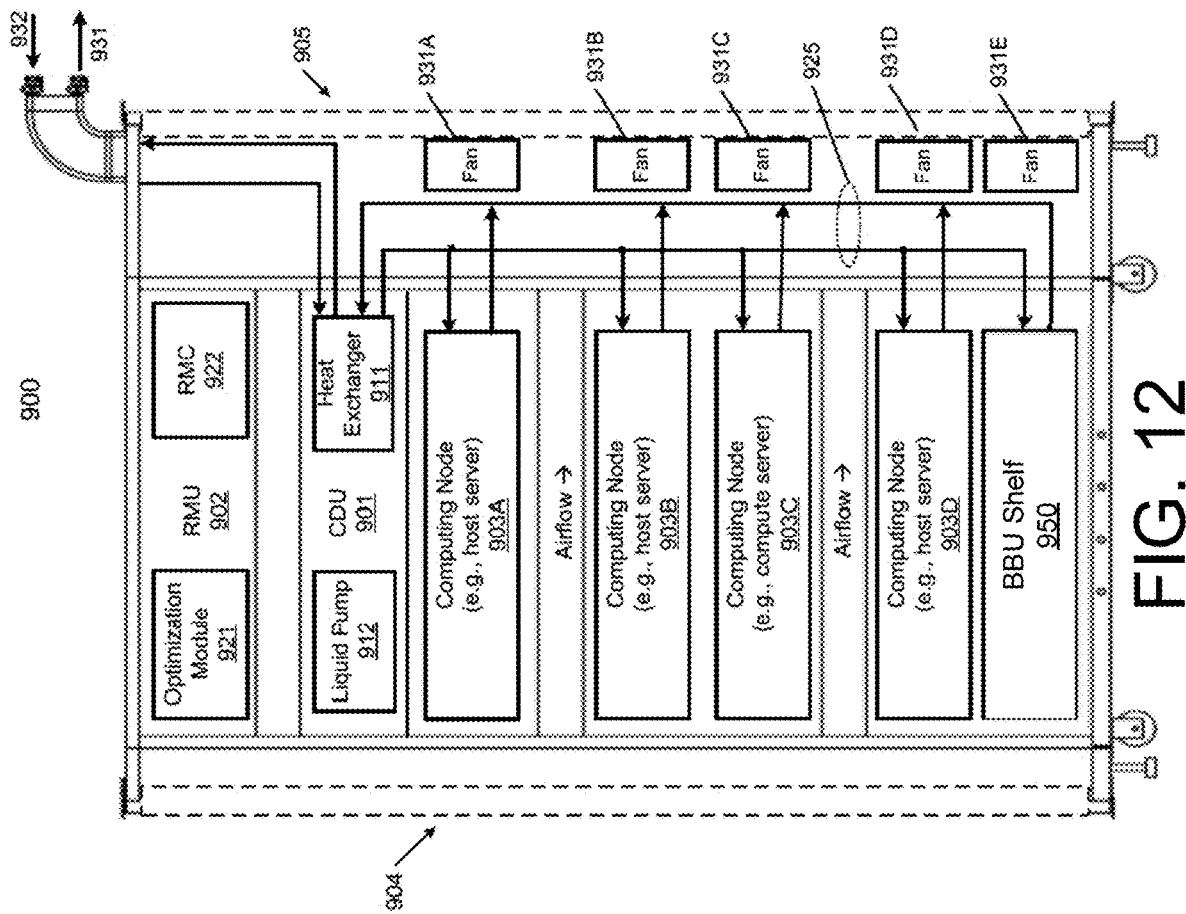

SHELF DESIGN FOR BATTERY MODULES

FIELD

Embodiments of the invention relate generally to batteries, battery modules and housing for battery modules. More particularly, embodiments of the invention relate to shelf designs for battery modules.

BACKGROUND

Today, data centers are common place for housing large groups of networked servers, typically used by enterprises or organizations for remote storage, processing, or distribution of large amounts of data. Data centers can house thousands of servers and, thus, require exorbitant amounts of power from utility providers. In case of power failure with a utility provider, data centers have backup power systems. Traditional backup power systems use lead acid based battery systems, which are being replaced with backup battery units (BBUs) based on lithium-ion batteries. These types of lithium-ion battery BBUs are becoming popular for backup power systems in a data center. BBUs are housed in shelves such that each shelf includes any number of BBUs. In this way, BBUs can be moved from a centralized battery room to racks in the data center. Thermal management is needed for BBUs in shelves populated in the racks for data centers.

For instance, within a data center, the servers can generate significant amounts of heat along with BBUs if in operation delivering power to the servers or recharging to be used again. The thermal environment within a data center is typically designed and operated based on information technology (IT) specifications and requirements, but the thermal system design for BBUs present new challenges. For instance, BBUs primary function is to provide backup power as needed. That is, a BBU discharges power during, e.g., a main power outage, until main power returns, and, in the meantime, the BBU is recharging. Heat can be generated during discharging and recharging of a BBU and, thus, thermal management of the BBU is required during discharging and recharging in order to prevent overheating and damage to the BBU and surroundings.

BRIEF DESCRIPTION OF THE DRAWINGS

The appended drawings illustrate examples and embodiments and are, therefore, exemplary and not considered to be limiting in scope.

FIG. 12 is a block diagram illustrating an example of an electronic rack according to one embodiment.

DETAILED DESCRIPTION

Figure 1:
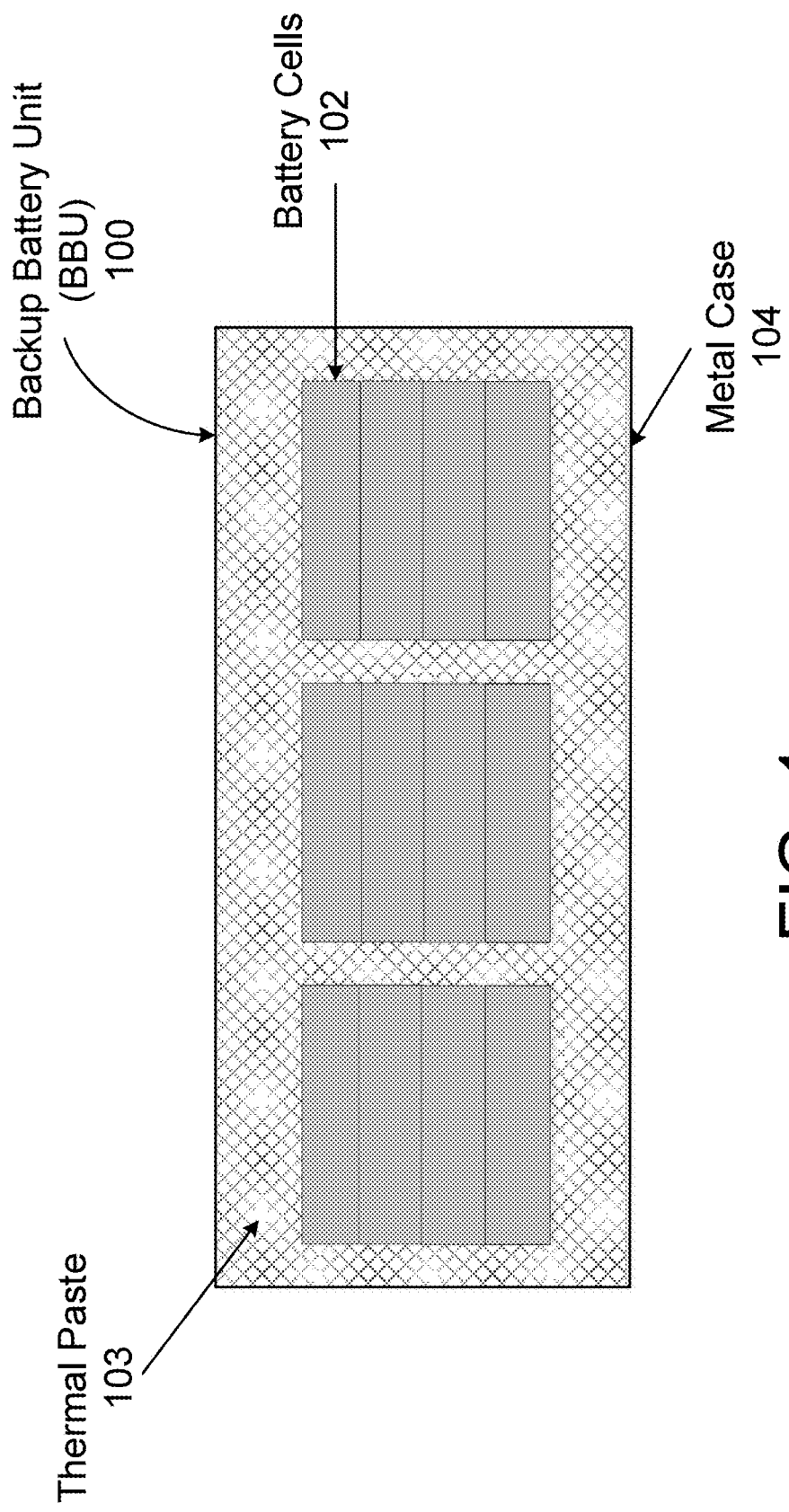
FIG. 1 illustrates a backup battery unit (BBU) according to one embodiment.

As set forth in the detailed description, various embodiments, examples and aspects will be described with reference to details discussed below, and the accompanying drawings will illustrate various embodiments and examples. The following description and drawings are illustrative and are not to be considered as limiting. Numerous specific details are described to provide a thorough understanding of various embodiments and examples. However, in certain instances, well-known or conventional details are not described to facilitate a concise discussion of the embodiments and examples.

Reference in the detailed description to "one embodiment" or "one example" means that a particular feature, structure, or characteristic described in conjunction with the embodiment or example can be included in at least one embodiment or example of the disclosure. The appearances of the phrase "in one embodiment" or "in one example" in various places in the detailed description do not necessarily refer to the same embodiment or example. Although the following embodiments or examples refer to backup battery units (BBUs), the embodiments and examples can be implemented for any type of battery systems and application such as battery systems for electrical vehicles, data center, or large scale battery backup systems.

The following embodiments and examples provide a simple and reliable heat transfer and thermal management techniques for BBU modules along with structural designs for a BBU shelf, including a cooling frame, and BBU module packing method. According to one embodiment, a backup battery shelf that comprises a cooling frame and a thermal conductive pad disposed on one or more surfaces of the shelf. The cooling frame, also operating as a housing to house the BBUs, includes an outer container and an inner container that is enclosed by the outer container. For one embodiment, the inner container of the cooling frame includes one or more slots (also referred to as BBU slots) each can receive a backup battery unit (BBU). A cooling liquid circulation area is formed based on the space between the outer container and the inner container of the cooling frame that is configured to circulate a cooling liquid around the inner container to remove heat generated from the BBUs contained within inner container. For one embodiment, the thermal conductive pad is configured to transfer heat from a BBU to the cooling frame and liquid circulating within the cooling frame.

For one embodiment, the cooling frame includes one or more chambers to move the cooling liquid. The cooling frame includes one or more chambers to pass the cooling liquid. The backup battery shelf also includes a supply port to supply cooling liquid to the one or more chambers of the cooling frame, and a return port to extract cooling liquid from the one or more chambers of the cooling frame out of the battery shelf. In this way, the cooling frame can act as a cooling plate. For one embodiment, the BBU can include a lithium ion battery, which can be used as a backup power source at a data center. For one embodiment, the cooling liquid includes water and heat generated from one or more cells in a BBU can be transferred to moving water in the cooling frame by way of the thermal conductive pad. The heated water can thus be extracted out of the cooling frame and shelf thus providing a simple and effective thermal control for a BBU shelf.

According to one embodiment, a backup battery unit (BBU) module includes a plurality of battery cells and a cooling frame. The cooling frame surrounds the plurality of battery cells and configured to circulate a cooling liquid such that heat generated from the battery cells is transferred to the cooling liquid in the cooling frame. The BBU module can further include a thermal paste surrounding the plurality of battery cells and a metal casing surrounding the plurality of battery cells and thermal paste, wherein the metal casing is thermally coupled to the cooling frame. Heat generated from the plurality of battery cells can be transferred to the cooling frame by way of thermal paste and metal casing.

For one embodiment, the BBU module further includes a supply port and a return port. The supply supplies the cooling liquid to the cooling frame and the return port extracts the cooling liquid from the cooling frame. The cooling frame can include one or more chambers to move the cooling liquid and acts a cooling plate. The cooling liquid can include water. Heat generated from the plurality of battery cells can be transferred to the moving water in the cooling frame. The battery cells can include lithium-ion ones. The BBU module disclosed herein can be stacked in a backup battery unit (BBU) shelf.

BBU Shelf Examples with a Cooling Frame

FIG. 1 illustrates a backup battery unit (BBU) 100 according to one embodiment. The BBU 100 includes a metal case 104 housing a plurality of battery cells 102 surrounded by a thermal paste 103. Within BBU 100, the battery cells 102 can include lithium-ion battery cells connected both in series, in parallel, or a combination of both. The battery cells 102 can discharge power to connected devices, e.g., blade servers or other IT devices, and be recharged by an external power source, e.g., from a utility provider. During discharging and charging, battery cells 102 can generate heat. For one embodiment, heat generated from battery cells 102 during discharging or recharging is transferred to metal case 104 by way of thermal paste 103. Thermal paste 103 can be any type of thermally conductive paste such as conductive ceramic based paste. Metal case 104 can be any type of metal (e.g., steel, aluminum, alloy etc.) having thermal coupling properties capable of transferring heat from battery cells 102 to other contacting surfaces in order to move heat away from BBU 100.

For one embodiment, operating temperatures of 25° C.-35° C. is for the BBU cells 102. Operating at higher temperatures or lower temperatures may result in negative impact on the cells 102 performance and internal conditions. For one embodiment, BBU 100 can regulate temperature values by transferring heat to the metal case 104 and to a cooling frame of a BBU shelf as described in the following embodiments and examples to maintain stable internal temperatures within BBU 100 and not deteriorate battery performance and damage BBU 100. The cooling frame can include a cooling liquid to transfer heat from BBU 100 out of the shelf to further regulate temperature within BBU 100. For one embodiment, BBU 100 can include other components (not shown) such as convertors, control board, etc. and a thermal system to transfer heat generated by battery cells 102 to metal case 104 using thermal paste 103.

Figure 2:
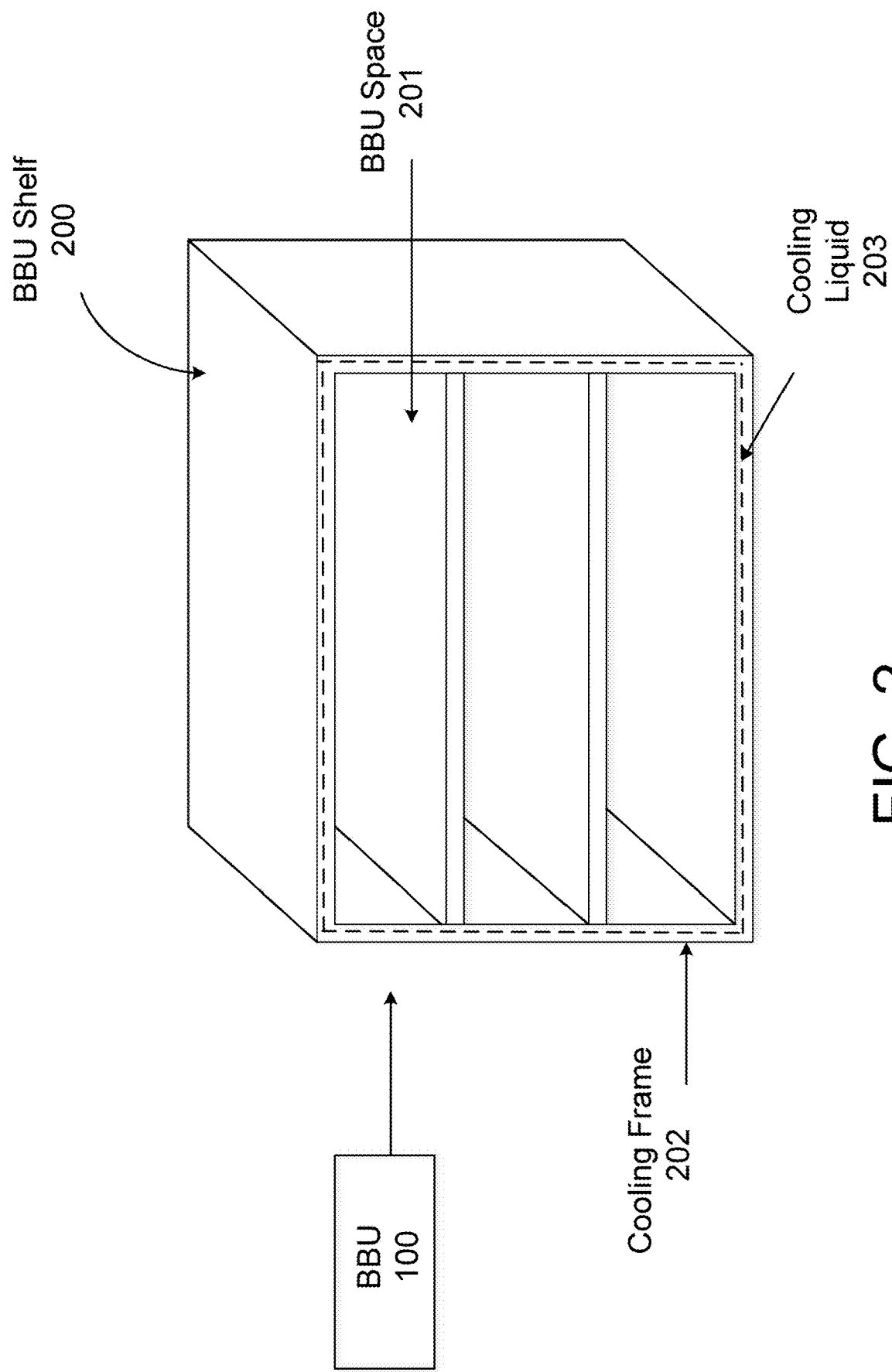
FIG. 2 illustrates a BBU shelf with a cooling frame according to one embodiment.

FIG. 2 illustrates a BBU shelf 200 with a cooling frame 202 according to one embodiment. BBU shelf 200 is an enclosure for populating multiple BBU 100 modules, which can be used in a data center to provide backup power to servers or other devices operating in a data center. BBU shelf 200 can be inserted into any slot of an electronic rack of a data center. For one embodiment, cooling frame 202 includes and supports a plurality of shelves defining BBU space 201. For example, BBU 100 of FIG. 1 can be inserted into BBU space 201 defined by cooling frame 202. For one embodiment, cooling frame 202 includes a number of sides, and each side can include chambers to allow cooling liquid 203 to move or circulate within cooling frame 202. Sides can also include a shelf also having a chamber for moving or circulating cooling liquid such as water. Cooling liquid 203 can include water or other thermally conductive liquid. For the purpose of illustration, water is used as an example of cooling liquid throughout this application, however, other types of cooling liquid or coolant can also be utilized.

In one embodiment, BBU shelf 200 includes an outer container and an inner container that is enclosed by the outer container. A space is formed between the outer container and the inner container to receive and circulate cooling liquid 203. Cooling liquid 203 is circulated around inner container that contains the BBU space such as BBU space 201 to extract and remove heat generated by the BBU modules contained within the inner container. As shown in FIG. 2, the inner container and the outer container are formed like an inner tube inserted into an outer tube, and cooling liquid 203 is circulates in the space between the inner tube and outer tube. A BBU model can be inserted into any of the BBU slots contained within the inner tube from the frontend. The backend may include a liquid supply port to receive cooling liquid from an external liquid source and a liquid return port to return the cooling liquid to the external source, carrying the heat exchanged from the BBUs.

For example, in operation during discharging or charging, heat from BBU 100 can be transferred to a surface of cooling frame 202 that passes to cooling liquid 203 or water. For one embodiment, water as cooling liquid 203 can circulate and exit cooling frame 202 such that heat transferred from BBU to the water is removed from BBU shelf 200. In this way, BBU shelf 200 including cooling frame 202 can act as a cooling plate and heat is extracted to the water through the cooling frame 202 can be finally removed by recirculating cooling liquid. As a result, once a BBU 100 is loaded in the BBU shelf 200, the cooling mechanism is in place to transfer heat from battery cells 102 to water in cooling frame 202 which can exit BBU shelf 200 by recirculating water. In this example, the entire BBU shelf 200 can be loaded with water to transfer heat away from BBU 100.

Figure 3:
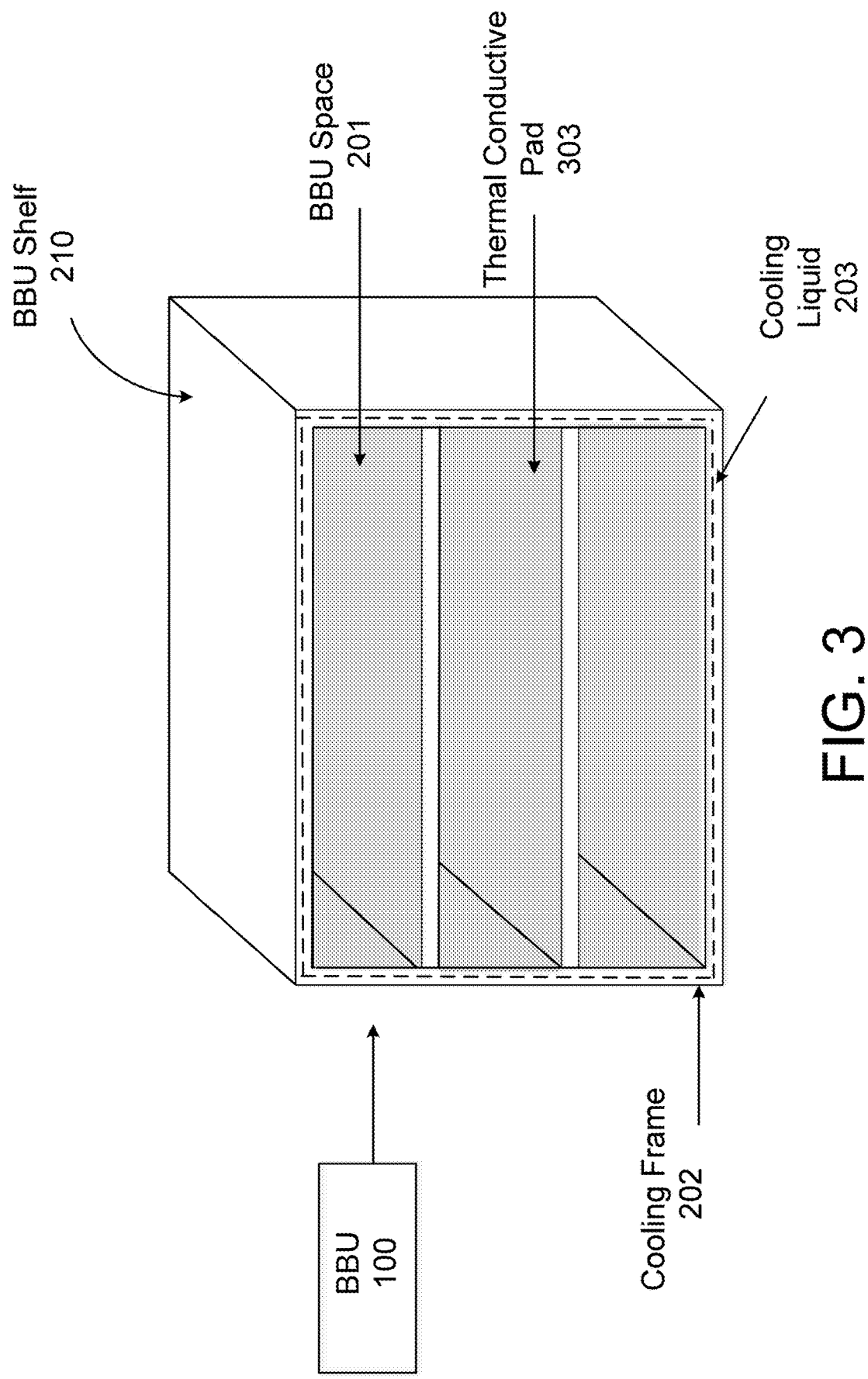
FIG. 3 illustrates a BBU shelf with a cooling frame and a thermal conductive pad according to one embodiment.

FIG. 3 illustrates a BBU shelf 210 with a cooling frame 202 and a thermal conductive pad 303 according to one embodiment. BBU shelf 210 can have same design as BBU shelf 200 with the addition of thermal conductive pad 303 on sides of cooling frame 202 to make contact with BBU 100 within BBU space 201. Thermal conductive pad 303 can include any type of thermal conductive material such as acrylic elastomer or like materials to assist with thermal connection between BBU 100 and BBU shelf 210 including cooling frame 202. In this example, thermal conductive pad 303 is formed on a surface of a shelf and along the walls with the BBU space 201 defined by cooling frame 202. BBU 100 can make a full contact with a thermal conductive pad 303 on any number of surfaces defined by cooling frame 202.

For example, depending on the size and shape of BBU 100, BBU 100 can have a bottom surface of metal case 104 in contact with thermal conductive pad 303 on a top surface of a shelf within BBU space 201. In this example, heat generated from battery cells 102 within BBU 100 can be transferred to metal case 104 by way of thermal paste 103. That heat from metal case 104 can be transferred to thermal conductive pad 303 to cooling frame 200 and eventually transferred out of BBU shelf 210 by way of cooling liquid 203 (e.g., water) circulating in out of cooling frame 202.

Figure 4A:
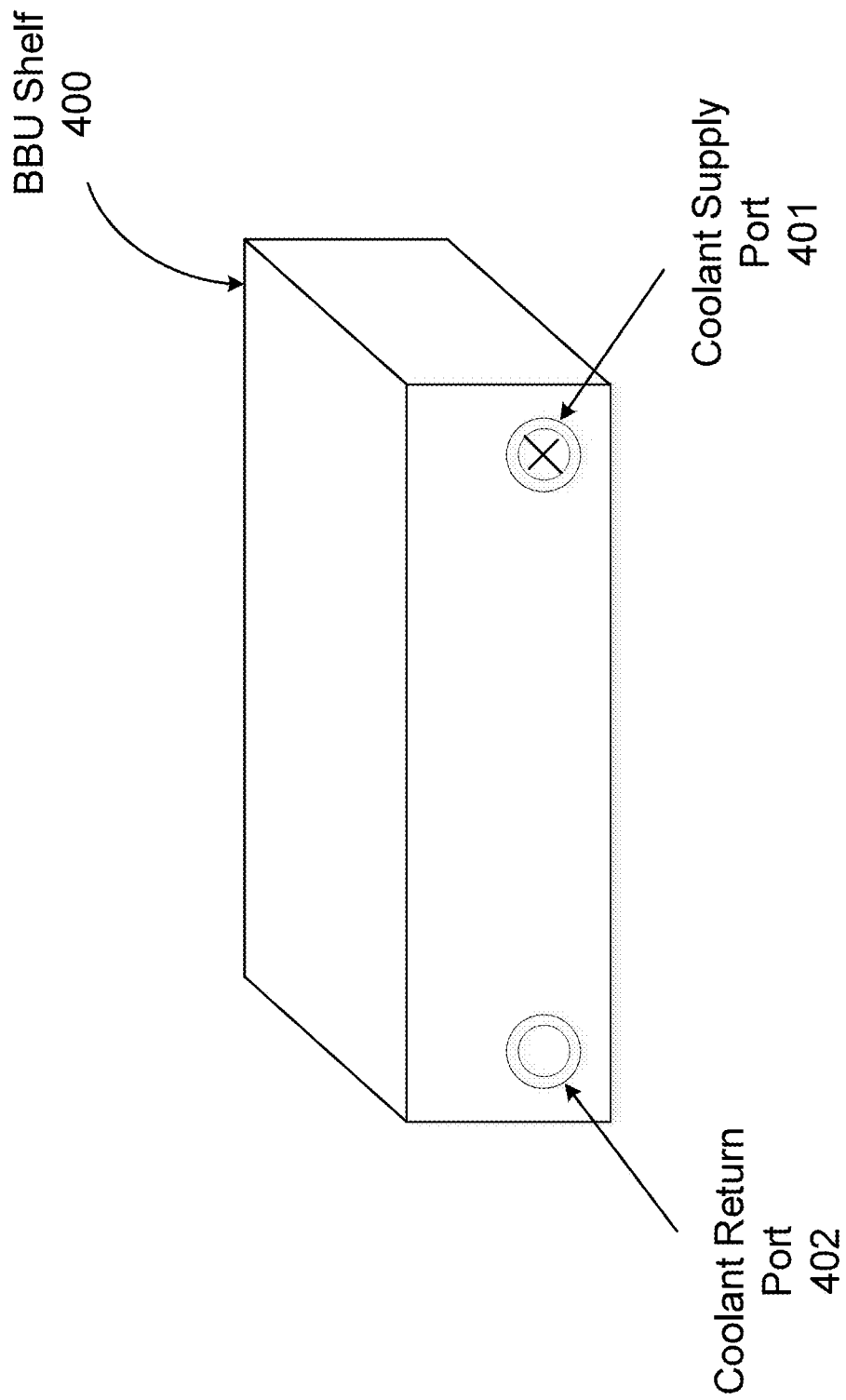
FIG. 4A illustrates a backside of one shelf area or level of the BBU shelf having a coolant support port and coolant return port according to one embodiment.

FIG. 4A illustrates a backside of one shelf area or level of the BBU shelf 400 having a coolant supply port 401 and coolant return port 402 according to one embodiment. For another embodiment, coolant supply port 401 and coolant return port 502 can be on the front side BBU shelf 400. For one embodiment, a cooling liquid or coolant supply line can be attached or connected to coolant supply port 401 to supply a cooling liquid or fluid, e.g., water, and liquid line (e.g., water line) can be attached or connected to coolant return port 402 to extract cooling liquid from BBU shelf 400. For this example, coolant supply port 401 and coolant return port 402 are configured on the back side of BBU shelf 400. For other examples, coolant supply port 401 and coolant return port 402 can be configured on the sides or in front of BBU shelf 400 to receive, e.g., cooling liquid lines, for supplying or extracting cooling liquid such as water.

For one embodiment, coolant supply port 401 and coolant return port 402 can include quick disconnect devices such as, e.g., dripless connectors including male or female connectors or blind mate connectors. Connectors for coolant supply port 401 and coolant return port 402 can connect to external liquid supply and return. BBU shelf 400 can include any type of rack level liquid distribution manifold or liquid supply and return to any type of liquid sources, e.g., water sources. For example, water can be supplied to the BBU shelf 400 through coolant supply port 401 and into chambers of a cooling frame that are circulated within BBU shelf 400. Heat transferred to the water from BBU units or modules can be extracted out of BBU shelf 400 by way of coolant return port 402.

Figure 4B:
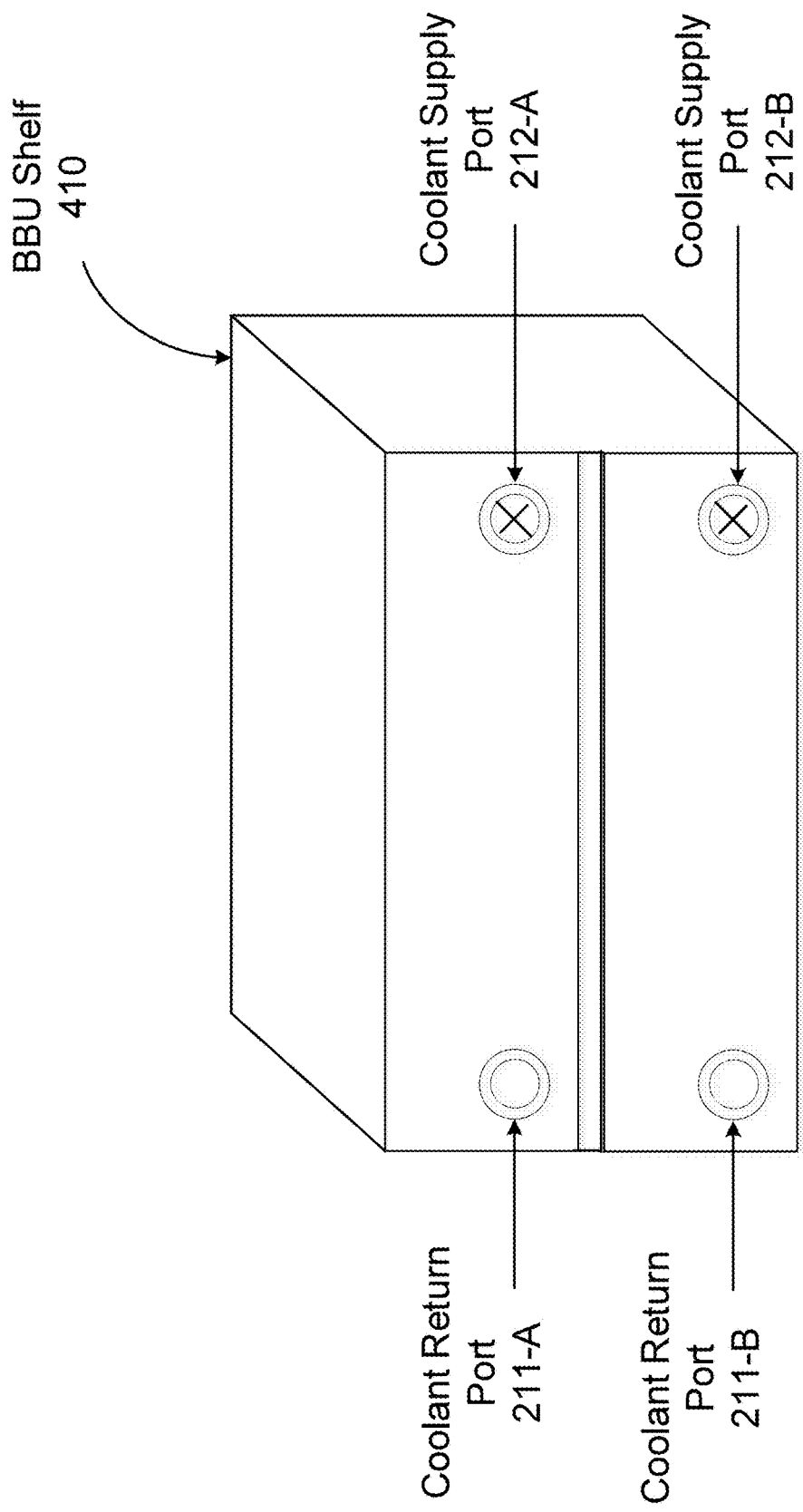
FIG. 4B illustrates a backside of multiple shelf areas or levels of the BBU shelf having a coolant support port and coolant return port for each shelf area or level according to one embodiment.

FIG. 4B illustrates a backside of multiple shelf areas or levels of the BBU shelf 410 having coolant support ports (212-A, 212-B) and coolant return ports (211-A, 211-B) for each shelf area or level according to one embodiment. Referring to FIG. 4B, in this example, the back side of two shelves or levels of BBU 410 are shown, however, BBU shelf 410 can include any number of shelves or levels providing multiple liquid or fluid channels. Coolant support ports (212-A, 212-B) and coolant return ports (211-A, 211-B) are configured and operate in the same manner as coolant supply port 401 and coolant return port 402 shown in FIG. 4A.

For one embodiment, each shelf or level or BBU space within BBU shelf 410 receives and extracts liquid or fluid, e.g., water, independently from other shelves, levels or BBU space within BBU shelf 410. Each shelf, level or BBU space can include a cooling frame having one or more chambers to circulate cooling liquid such as water. For other embodiments, a cooling supply port 212-B and cooling return port 211-B can supply and extract water the two shelves or levels shown in FIG. 4B using one pair of ports. Likewise, cooling supply port 212-A and cooling return port 211-A can supply and extract water for the two shelves or levels shown in FIG. 4B using one pair of ports. For another embodiment, a fluid distribution manifold design can be used attaching on the BBU shelf. The manifold can have a main fluid supply and return port connecting to the external loop, and the manifold sub-ports can distribute fluid to multiple shelf levels.

Figure 5:
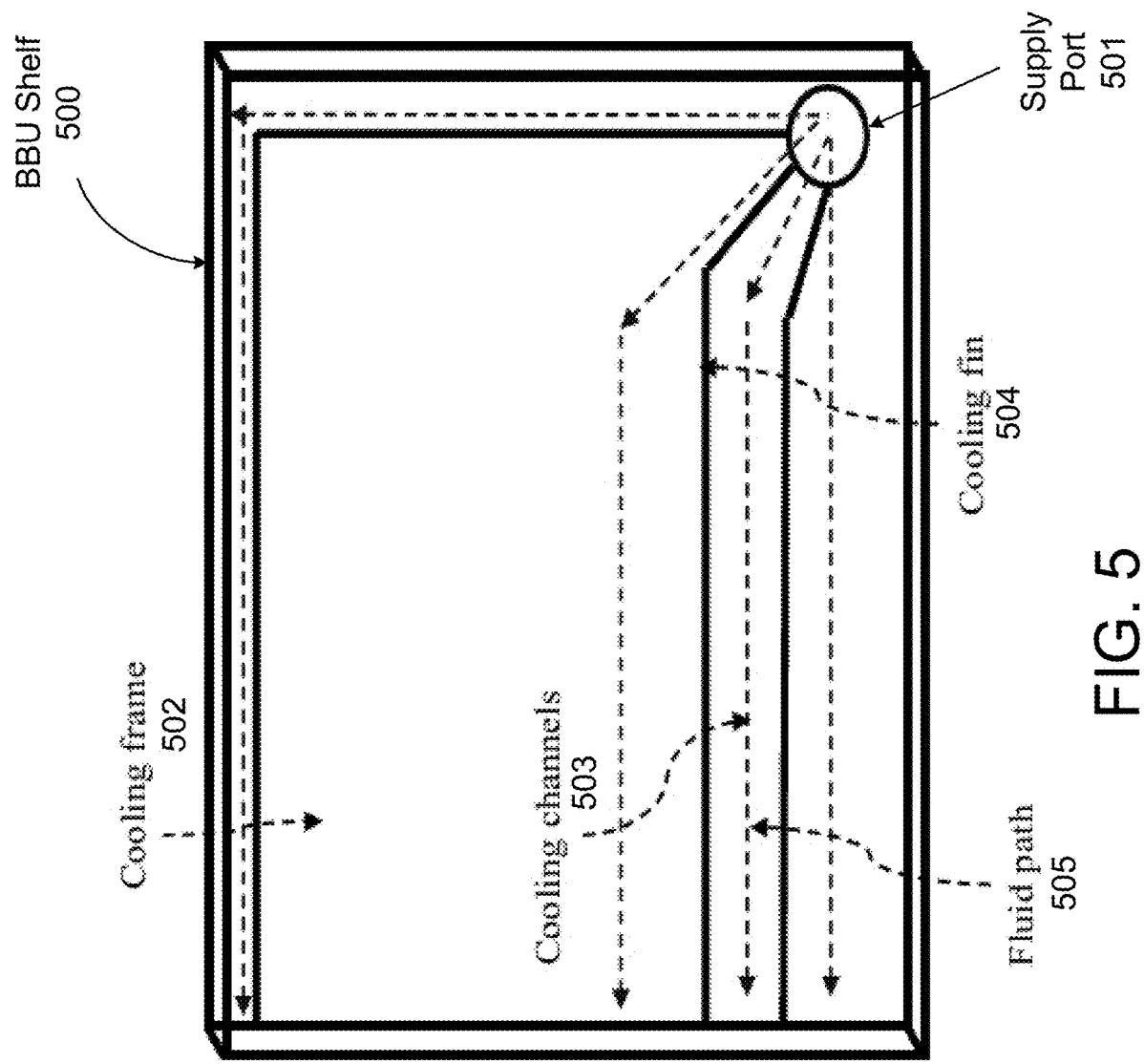
FIG. 5 illustrates a BBU shelf showing cooling channels within a cooling frame according to one embodiment.

FIG. 5 illustrates BBU shelf 500 showing cooling channels 503 within cooling frame 502 according to one embodiment. For this example, cooling frame 502 can represent any side of BBU shelf 500, e.g., a back side of BBU shelf 500. Within cooling frame 502 includes any number of cooling fins 504 to define any number of cooling channels 503 for a fluid path 505 in each channel. For one embodiment, a supply port 501 is provided on BBU shelf 500 for cooling frame 502 to supply a cooling liquid, e.g., water, to a cooling channel 503 along a fluid path 505. Although not shown, a return port can also be added to cooling frame 502 5o extract a cooling liquid from fluid path 505.

For one embodiment, a cooling liquid or fluid supplied from the supply port 501 can be distributed to and throughout the cooling channels 503. Cooling fins 504 can be used for enhancing heat transfer area to the cooling liquid or fluid. For one embodiment, the number of channels, size of the channels, the channel arrangement configurations and other design dimensions of the channels can be dependent on the heat transfer efficiency to be achieved for the type of BBU units or modules being used and power provided by the units and modules. For one embodiment, a surface of cooling frame 502 can make contact with a BBU unit or module (e.g., BBU unit 100) directly or by way of a thermal conductive pad (e.g., thermal conductive pad 303) on a BBU shelf (e.g., BBU shelf 200 or BBU shelf 210).

Figure 6:
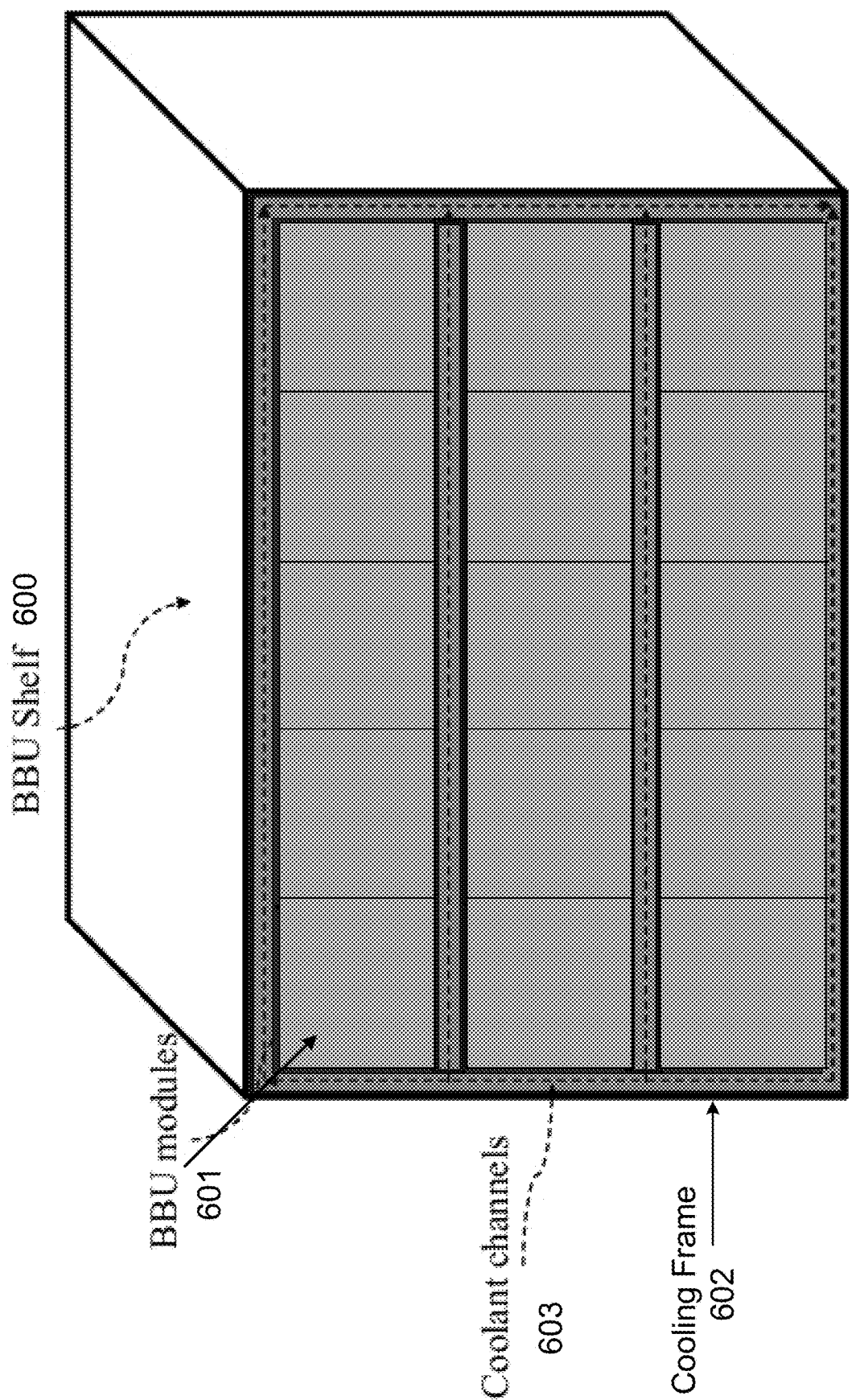
FIG. 6 illustrates a BBU shelf having a cooling frame populated with BBU modules according to one embodiment.

FIG. 6 illustrates a BBU shelf 600 having a cooling frame 602 populated with BBU modules 601 according to one embodiment. For this example, cooling frame 602 includes cooling channels 603 for moving or circulating cooling liquid or fluid, e.g., water. Referring to FIG. 6, BBU shelf 600 includes three shelves for three rows of BBU modules 601. Each shelf or row can house five or multiple BBU modules 601 for a total of fifteen or more BBU modules 601 for BBU shelf 600. For one embodiment, the BBU shelf 600 may also be partially populated and in actual use. The number of rows and BBU modules 601 are exemplary in which BBU shelf 600 can have any number of rows and BBU modules 601. Within each shelf, a thermal conductive pad (e.g., thermal conductive pad 303) can be lined within BBU shelf 600 that makes contact with BBU modules 601 and cooling frame 602. In this way, BBU modules 601 are thermally coupled to cooling frame 602.

For one embodiment, heat generated from BBU modules 601 can be transferred to cooling frame 602 and then to cooling liquid within cooling channels 603 by way of one or more surfaces, e.g., metal casing of BBU modules 601, thermal conductive pad, and surface of cooling frame 602 and then to cooling liquid flowing in cooling channels 603. Cooling channels 603 can flow through any of the sides of BBU shelf 600 including the top side, bottom side, left and right sides, as well as along a shelf. For one embodiment, on the back side of BBU shelf 600 can have any number of support ports or return ports for supplying or extracting cooling liquid, e.g., water, in order to transfer heat away from BBU modules 601 and away from shelf 600.

BBU Module Examples with a Cooling Frame

Figure 7:
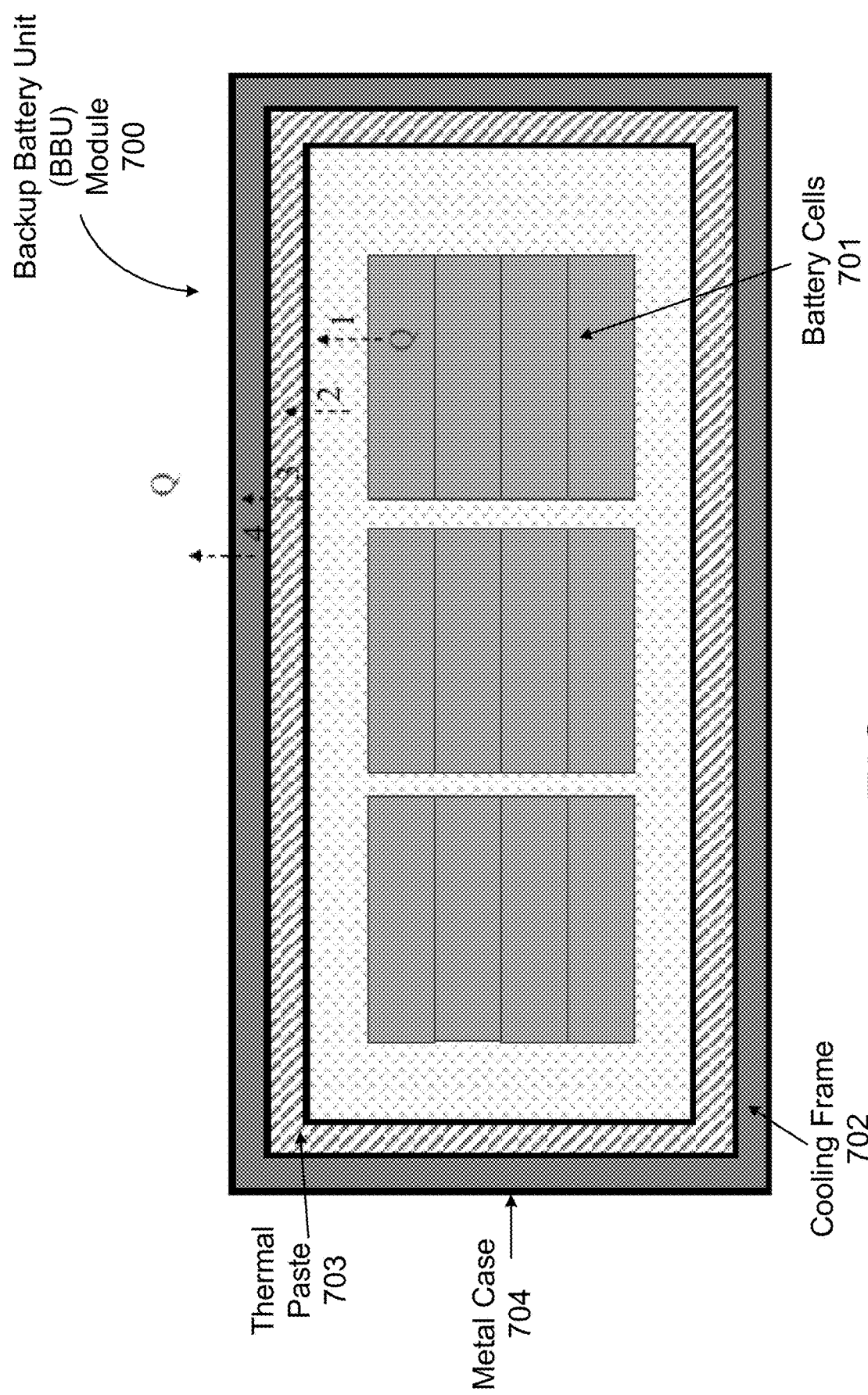
FIG. 7 illustrates a BBU module having a cooling frame according to one embodiment.

FIG. 7 illustrates a BBU module 700 having a cooling frame 702 according to one embodiment. Referring to FIG. 7, for one embodiment, BBU module 700 includes a plurality of battery cells 701 surrounded by thermal paste 703.

A metal case 704 surrounds the battery cells 701 and thermal paste. The cooling frame 702 is in contact and surrounds metal case 704. The cooling frame 702 includes cooling chambers to move and circulate a cooling liquid such as water. For other embodiments, a thermal conductive pad can be disposed between the metal case 704 and cooling frame 702.

For one embodiment, with reference to heat "Q" transferred from battery cells 701, the process flow for Q is shown with reference to numerals 1 to 4 in FIG. 7. At step 1, heat Q from the battery cells 701 is transferred to the thermal paste 703. At step 2, heat Q from the thermal paste 703 is transferred to metal case 704 and/or in addition to a thermal pad. At step 3, the heat Q is transferred from the metal case 704 to cooling frame 702. At step 704, the heat Q is transferred away from BBU module 700. For one embodiment, heat Q is transferred from BBU module 700 by way of circulating liquid in cooling frame 702 exiting cooling frame 702 to an external cooling source.

Figure 8:
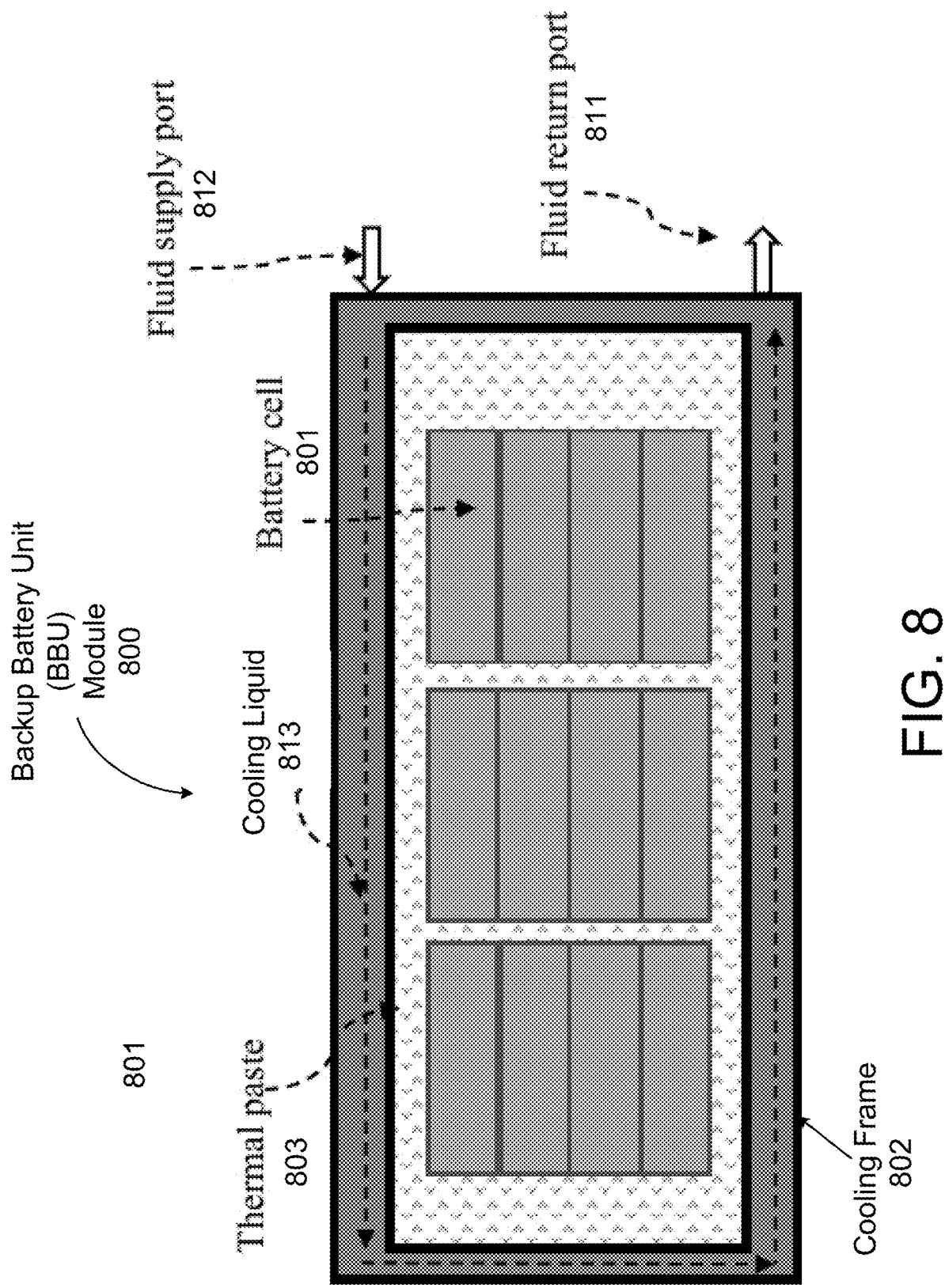
FIG. 8 illustrates a BBU module having a cooling frame with supply and return ports for supplying control logic for optimizing battery cooling system with multiple cooling loops and extracting a cooling liquid according to one embodiment.

FIG. 8 illustrates a BBU module 800 having a cooling frame 802 with fluid supply and return ports (812, 811) for supplying and extracting a cooling liquid 813 according to one embodiment. For this embodiment, the cooling frame 802 acts as housing for BBU module 800 without the need having a metal casing around the battery cells 801 and thermal paste 803. Referring to FIG. 8, heat generated by battery cells 801 is transferred to cooling frame 802 moving or circulating cooling liquid 813 through thermal paste 803.

For one embodiment, fluid supply port 812 supplies a cooling liquid 813, e.g., water, to cooling frame 802. As the water is heated by heat generated from battery cells 801, the heated water is transferred out of cooling frame 802 by way of fluid return port 811. In this way, heat generated by battery cells 801 is transferred away from BBU module 800 without the need of a BBU shelf needing a cooling frame. The cooling frame 802 can also include any number of channels and fins to move cooling liquid 813 throughout cooling frame 802.

Figure 9:
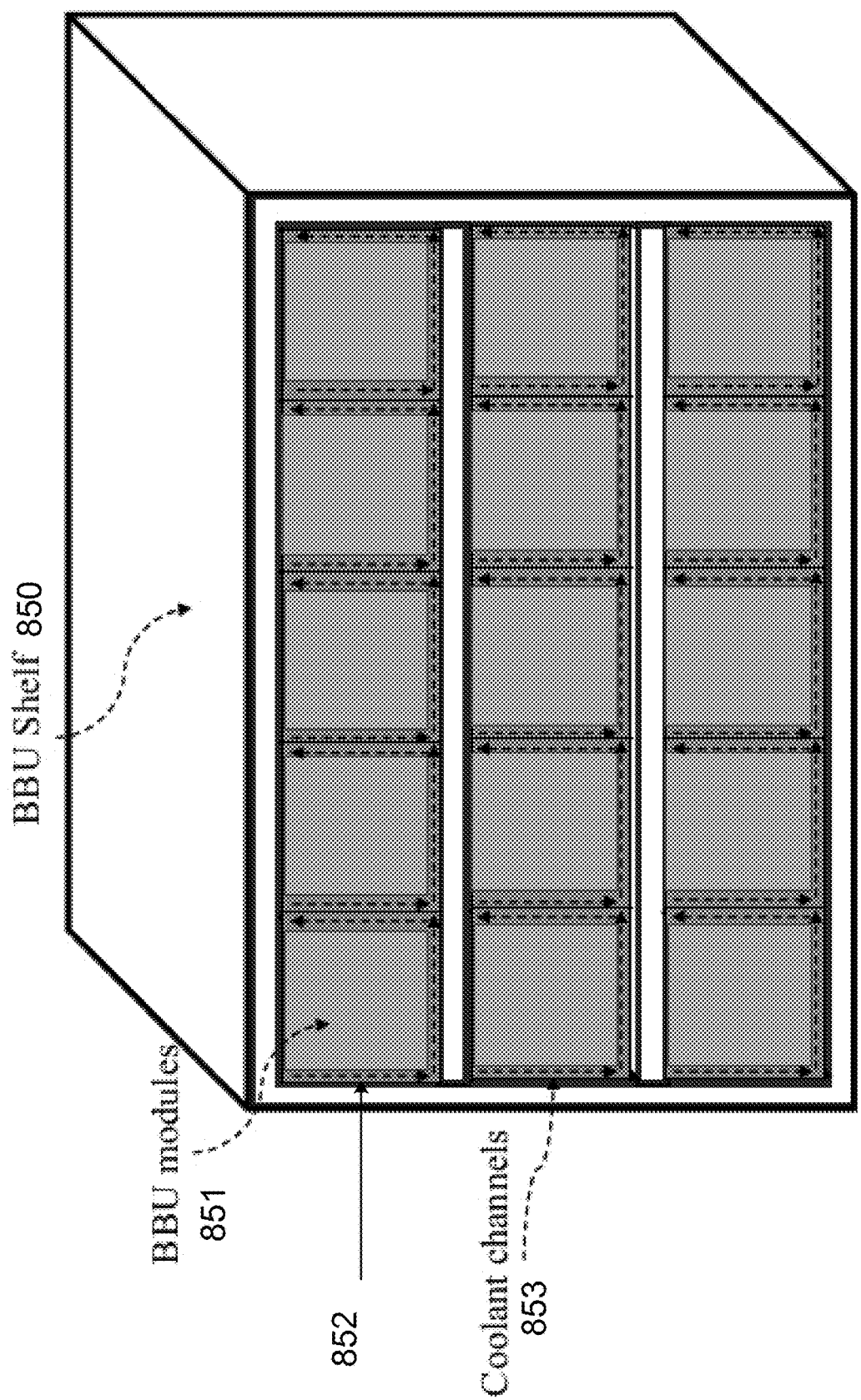
FIG. 9 illustrates BBU shelf populated having BBU modules with cooling frames according to one embodiment.

FIG. 9 illustrates BBU shelf 850 populated having BBU modules 851 with cooling frames 852 according to one embodiment. For example, each BBU module 851 is encased in its own cooling frame 852 having cooling channels 853 for circulating a cooling liquid or fluid such as water. Referring to FIG. 9, BBU shelf 850 includes three shelves for three rows of BBU modules 851 having its own cooling frame 852. In this example, each shelf or row can house five BBU modules 851 for a total of fifteen BBU modules 851 for BBU shelf 850. In other examples, any number of rows and BBU modules 851. Although not shown, each cooling frame 852 for each BBU module 851 can have supply ports and return ports to supply and extract a cooling liquid or fluid such as water.

For one embodiment, heat generated from BBU modules 851 can be transferred to its own cooling frame 852 and then to cooling liquid within cooling channels 853. Cooling channels 853 can move cooling liquid around the BBU modules and out of the BBU modules to an external cooling source. Supply and return ports can be easily connected to the BBU modules 851 and to an external source to supply and extract cooling fluid. In this way, cooling frames can be designed for individual BBU modules 851 in contrast to designing cooling frames for a BBU shelf.

Heat Transfer Flow Examples for BBU Shelf and BBU Modules with a Cooling Frame

Figure 10:
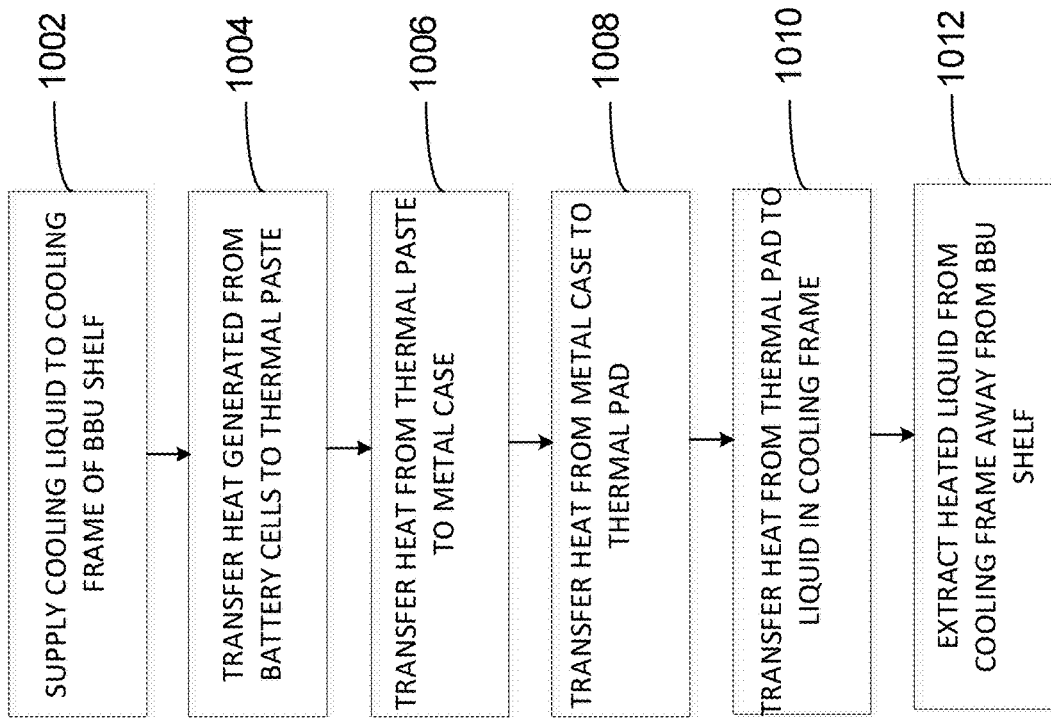
FIG. 10 illustrates a heat transfer flow diagram for a BBU shelf with a cooling frame according to one embodiment.

FIG. 10 illustrates a heat transfer flow diagram 1000 for a BBU shelf with a cooling frame according to one embodiment. Flow diagram 1000 includes blocks 1002 to 1012. At block 1002, a cooling liquid is supplied to a cooling frame of a backup battery unit (BBU) shelf. The cooling liquid can be a fluid such as water and supplied to the cooling frame by way of a supply port on the BBU shelf. At block 1004, heat generated from the battery cells is transferred to thermal paste. At block 1006, heat from the thermal paste is transferred to a metal case surrounding the battery cells. At block 1008, heat from the metal case is transferred to a thermal pad. At block 1010, heat from the thermal pad is transferred to liquid in a cooling frame such as water. At block 1012, the heated water is extracted from the cooling frame. For example, the heated water can be extracted by way of a return port on the BBU shelf to extract the heated water away from a BBU shelf.

Figure 11:
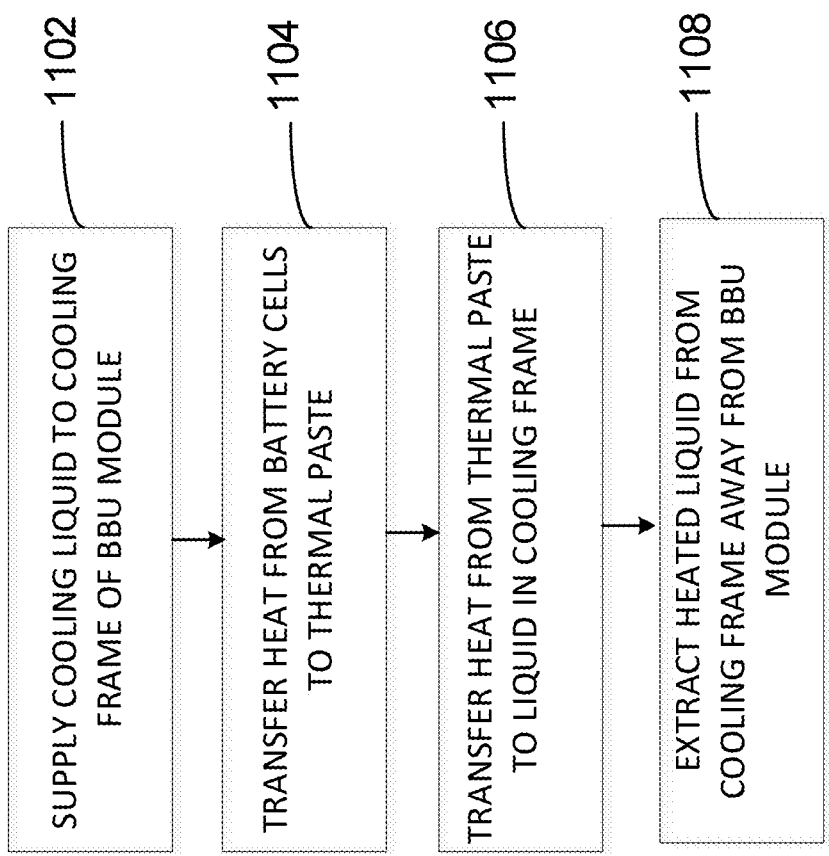
FIG. 11 illustrates a heat transfer flow diagram for a BBU module with a cooling frame according to one embodiment.

FIG. 11 illustrates a heat transfer flow diagram 1100 for a BBU module with a cooling frame according to one embodiment. Flow diagram 1100 includes blocks 1102 to 1108. At block 1102, cooling liquid is supplied to a cooling frame of a BBU module. For one embodiment, cooling frame is part of the outer casing of the BBU module and cooling liquid can be supplied using a supply port on the cooling frame. At block 1104, heat generated from battery cells within the BBU module is transferred to thermal paste. At block 1106, heat from the thermal paste is transferred to cooling liquid in the cooling frame. At block 1108, the heated liquid in the cooling frame is extracted from the cooling frame. For example, the heated liquid can be extracted by way of a return port on the cooling frame.

FIG. 12 is a block diagram illustrating an example of an electronic rack according to one embodiment. Electronic rack 900 may include one or more server slots to contain one or more servers respectively. Each server includes one or more information technology (IT) components (e.g., processors, memory, storage devices, network interfaces). According to one embodiment, electronic rack 900 includes, but is not limited to, CDU 901, rack management unit (RMU) 902 (optional), BBU shelf 950 (which may include one or more battery modules as described herein), and one or more server blades 903A-903D (collectively referred to as server blades 903). Server blades 903 can be inserted into an array of server slots respectively from frontend 904 or backend 905 of electronic rack 900. The BBU shelf 950 may be inserted into any of server slots 903 within the electronic rack 900. In one embodiment, one or more BBUs may be inserted into any of server slots 903 within the electronic rack 900.

Note that although there are only four server blades 903A-903D shown here, more or fewer server blades may be maintained within electronic rack 900. Also note that the particular positions of CDU 901, RMU 902, BBU shelf 950, and server blades 903 are shown for the purpose of illustration only; other arrangements or configurations of CDU 901, RMU 902, BBU 90, and server blades 903 may also be implemented. Note that electronic rack 900 can be either open to the environment or partially contained by a rack container, as long as the cooling fans can generate airflows from the frontend to the backend. BBU shelf 950 can be any of the BBU shelf devices described above.

In addition, a fan module can be associated with each of the server blades 903, and the BBU 90. In this embodiment, fan modules 931A-931E, collectively referred to as fan modules 931, and are associated with server blades 903A-903D, respectively. Each of the fan modules 931 includes one or more cooling fans. Fan modules 931 may be mounted on the backends of server blades 903 and BBU shelf 950 to generate airflows flowing from frontend 904, traveling through the air space of the sever blades 903, and existing at backend 905 of electronic rack 900. In one embodiment, each of the fan modules may be mounted on the backends of the server blades 903 and BBU shelf 950. For example, a fan module (e.g., 931E) may pull the warmed air into the air exhaust chamber of a battery module of the BBU shelf 950 and expel the air out of the module and the BBU. In another embodiment, one or more of the fan modules may be positioned on the frontend 904 of the rack 900. Such frontend fans may be configured to push air into the server blades 903 and/or BBU shelf 950.

In one embodiment, CDU 901 mainly includes heat exchanger 911, liquid pump 912, and a pump controller (not shown), and some other components such as a liquid reservoir, a power supply, monitoring sensors and so on. Heat exchanger 911 may be a liquid-to-liquid heat exchanger. Heat exchanger 911 includes a first loop with inlet and outlet ports having a first pair of liquid connectors coupled to external liquid supply/return lines 931-932 to form a primary loop. The connectors coupled to the external liquid supply/return lines 931-932 may be disposed or mounted on backend 905 of electronic rack 900. The liquid supply/return lines 931-932 are coupled to a set of room manifolds, which are coupled to an external heat removal system, or extremal cooling loop. In addition, heat exchanger 911 further includes a second loop with two ports having a second pair of liquid connectors coupled to liquid manifold 925 to form a secondary loop, which may include a supply manifold to supply cooling liquid to server blades 903 and a return manifold to return warmer liquid back to CDU 901. Note that CDUs 901 can be any kind of CDUs commercially available or customized ones. Thus, the details of CDUs 901 will not be described herein.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 900 further includes optional RMU 902 configured to provide and manage power supplied to servers 903, fan modules 931, and CDU 901. Optimization module 921 and RMC 922 can communicate with a controller in some of the applications. RMU 902 may be coupled to PSU 950 to manage the power consumption of the PSU. The PSU 950 may include the necessary circuitry (e.g., an alternating current (AC) to direct current (DC) or DC to DC power converter, backup battery, transformer, or regulator, etc.) to provide power to the rest of the components of electronic rack 900.

In one embodiment, RMU 902 includes optimization module 921 and rack management controller (RMC) 922. RMC 922 may include a monitor to monitor operating status of various components within electronic rack 900, such as, for example, computing nodes 903, CDU 901, and fan modules 931. Specifically, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of CDU 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance are adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT components of servers 903 (e.g., 903A, 903B, 903C, and/or 903D) may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. In addition, a switch is not shown here, which can be either air cooled or liquid cooled.

In the foregoing specification, embodiments and examples of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. An electronic rack, comprising:
   a plurality of server blades, each server blade including one or more servers to provide data processing services;
   a power supply unit coupled to the server blades to provide power to the server blades; and
   a backup battery unit (BBU) shelf to provide backup power to the sever blades when the power supply unit is unavailable, wherein the BBU shelf including
      a housing operating as a cooling frame, the cooling frame including an outer container and an inner container enclosed by the outer container, wherein the inner container includes one or more slots to receive one or more backup battery units (BBUs) that can be inserted from a frontend of the housing, each of the one or more BBUs containing one or more battery cells,
      a cooling liquid circulation area defined by a space between the outer container and the inner container to receive and circulate a cooling liquid around the inner container, and
      a thermal conductive pad disposed on one or more interiors surfaces of the inner container configured to transfer heat from at least one of the one or more BBUs to the cooling liquid circulating between the inner container and outer container.

2. The electronic rack of claim 1, wherein the cooling frame includes one or more chambers to pass the cooling liquid.

3. The electronic rack of claim 1, wherein the cooling frame is part of at least one battery module or part of a battery shelf housing the at least one battery module.

4. The electronic rack of claim 1, wherein the BBU shelf further includes: a supply port to supply the cooling liquid to the one or more chambers of the cooling frame, and a return port to extract the cooling liquid from the one or more chambers of the cooling frame out of the BBU shelf.

5. The electronic rack of claim 1, wherein the cooling frame acts as a cooling plate.

6. The electronic rack of claim 1, wherein the cooling liquid includes water.

7. The electronic rack of claim 6, wherein a BBU of the one or more BBUs transfers heat to moving water in the cooling frame which is extracted out of the BBU shelf.

8. The electronic rack of claim 6, wherein heat from one or more cells in a BBU is transferred to moving water in the cooling frame via the thermal conductive pad.

9. The electronic rack of claim 8, wherein the moving water in the cooling frame is extracted out of the cooling frame.

* * * * *